United States Patent
Tavallaei et al.

(10) Patent No.: US 9,921,911 B2
(45) Date of Patent: Mar. 20, 2018

(54) OFF-MEMORY-MODULE ECC-SUPPLEMENTAL MEMORY SYSTEM

(71) Applicant: HEWLETT-PACKARD DEVELOPMENT COMPANY, L.P., Houston, TX (US)

(72) Inventors: Siamak Tavallaei, Spring, TX (US); Matthew Schumacher, Houston, TX (US); Harvey White, Jr., Houston, TX (US); Chanh Hua, Houston, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 85 days.

(21) Appl. No.: 14/787,208

(22) PCT Filed: Jul. 31, 2013

(86) PCT No.: PCT/US2013/052943
§ 371 (c)(1),
(2) Date: Oct. 26, 2015

(87) PCT Pub. No.: WO2015/016883
PCT Pub. Date: Feb. 5, 2015

(65) Prior Publication Data
US 2016/0070616 A1 Mar. 10, 2016

(51) Int. Cl.
*G11C 29/00* (2006.01)
*G06F 11/10* (2006.01)
(Continued)

(52) U.S. Cl.
CPC .......... *G06F 11/1076* (2013.01); *G06F 3/064* (2013.01); *G06F 3/0619* (2013.01);
(Continued)

(58) Field of Classification Search
CPC .... G06F 11/1048; G06F 3/0619; G06F 3/064; G06F 3/0683; G06F 11/1076; G11C 2029/0411
See application file for complete search history.

(56) References Cited

U.S. PATENT DOCUMENTS

| 6,185,718 | B1 | 2/2001 | Dell et al. |
| 7,096,407 | B2 | 8/2006 | Olarig |

(Continued)

FOREIGN PATENT DOCUMENTS

| CN | 1959638 A | 5/2007 |
| CN | 101036131 A | 9/2007 |
| CN | 102681909 A | 9/2012 |

OTHER PUBLICATIONS

Huang, R. et al., IVEC: Off-chip Memory Integrity Protection for Both Security and Reliability, (Research Paper), Jun. 19-23, 2010 (12 pages).

(Continued)

*Primary Examiner* — Guy Lamarre
(74) *Attorney, Agent, or Firm* — Clifton L. Anderson

(57) ABSTRACT

A system includes off-memory-module ECC-supplemental memory. In a process, an ECC-capable memory controller converts non-ECC data words to ECC data words and distributes each ECC data word between a non-ECC memory module set (of one or more non-ECC memory modules) and the ECC-supplemental memory. A host computer system can include a baseboard on which are mounted an ECC-capable memory controller, off-memory-module ECC-supplemental memory, and sockets for installing non-ECC memory modules.

20 Claims, 3 Drawing Sheets

(51) Int. Cl.
*G06F 3/06* (2006.01)
*G11C 29/04* (2006.01)

(52) U.S. Cl.
CPC ........ *G06F 3/0683* (2013.01); *G06F 11/1048* (2013.01); *G11C 2029/0411* (2013.01)

(56) References Cited

U.S. PATENT DOCUMENTS

| | | |
|---|---|---|
| 7,117,421 B1 | 10/2006 | Danilak |
| 7,234,099 B2 | 6/2007 | Gower et al. |
| 7,519,894 B2 | 4/2009 | Wei Beta et al. |
| 7,761,771 B2 | 7/2010 | Gower et al. |
| 8,086,936 B2 | 12/2011 | Gower et al. |
| 2004/0163028 A1 | 8/2004 | Olarig |
| 2006/0123320 A1 | 6/2006 | Vogt |
| 2007/0168781 A1 | 7/2007 | Sutardja et al. |
| 2007/0250756 A1 | 10/2007 | Gower et al. |
| 2008/0140945 A1* | 6/2008 | Salessi ............... G06F 3/061 711/148 |
| 2008/0256292 A1* | 10/2008 | Flynn ............... G06F 1/183 711/114 |
| 2008/0266778 A1 | 10/2008 | Sprietsma et al. |
| 2010/0275000 A1* | 10/2010 | Huang ............... G06F 9/4401 713/2 |
| 2011/0084978 A1 | 4/2011 | Schuette |
| 2012/0075902 A1 | 3/2012 | MacWilliams et al. |
| 2012/0151300 A1 | 6/2012 | Tillema et al. |
| 2013/0132799 A1 | 5/2013 | Zhu et al. |
| 2014/0075134 A1* | 3/2014 | Quigley ............ G06F 11/1092 711/154 |

OTHER PUBLICATIONS

Korean Intellectual Property Office, International Searching Authority, The International Search Report and the Written Opinion, dated Apr. 25, 2014 (11 Pages).

* cited by examiner

OFF-MEMORY-MODULE ECC-SUPPLEMENTAL MEMORY SYSTEM

BACKGROUND

High-availability computing can avoid downtime due to inevitable data errors by using error-correcting code (ECC) memory systems. Error-correcting codes such as Hamming code or triple modular redundancy (TMR) employ redundancy to allow the most common data errors to be detected and corrected. To accommodate the redundancy, ECC memory modules typically provide nine bytes of storage (9×8=72 bits) for each eight bytes of data (64 bits) in a memory rank. Like non-ECC memory, memory can be provided in memory modules (e.g., SIMMs and DIMMs) to be installed on a baseboard. The actual error detection and correction is performed by an ECC-capable memory controller, which is typically on the baseboard. "ECC on SIMMs" (EOS) memory, which have controllers on the memory modules, can be used for systems without built-in ECC support.

BRIEF DESCRIPTION OF THE DRAWINGS

The following figures represent examples and not the invention itself.

DETAILED DESCRIPTION

Figure 1:
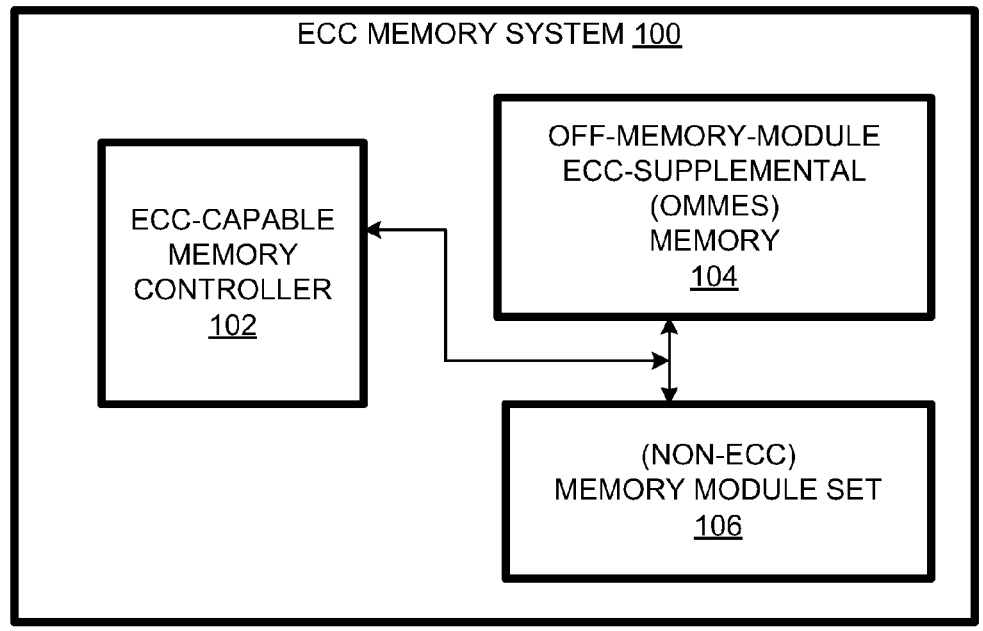
FIG. 1 is a schematic diagram of an ECC memory system in accordance with an example.

ECC memory modules can be expensive relative to non-ECC memory not only due to the extra capacity required for the redundant ECC codes, but also due to the economies of scale that favor the more widely used non-ECC memory modules. Thus, while capacity considerations alone would yield an about 12% premium for ECC memory modules, the actual premium can be up to 100% due largely to economies of scale. The premium for an EOS memory is even greater due to the incorporation of an ECC controller on each EOS memory module.

An ECC system 100 addresses the cost considerations associated with ECC memory modules by providing the extra capacity required by ECC encoded data words using off-memory-module ECC-supplemental (OMMES) memory. Thus, the cost-savings due to the economies of scale associated with non-ECC memory modules can be achieved in ECC-capable systems.

ECC system 100 includes an ECC-capable memory controller 102, OMMES memory 104, and a non-ECC memory module set 106. Herein, "non-ECC memory module set" refers to a set of one or more non-ECC memory modules. Those skilled in the art can readily differentiate ECC memory modules from non-ECC modules.

As is well known, computers typically store and communicate data as physical (e.g., electrical, magnetic, or optical) encodings of strings of zeroes and ones. One binary value can represent one "bit" of data. These bits are typically arranged in "data words" in the form of strings of binary values; the data words are typically a power of two bits long, e.g., 64 bits long. Eight bits is often referred to as a "byte", so a 64-bit data word can also be characterized as an 8-byte data word.

Rather than store an entire data word on a single memory device, segments of a data word can be distributed among plural memory devices so that the segments can be accessed in parallel. Herein, "memory device" refers to a monolithic integrated circuit designed primarily to store data; typically, memory devices are SDRAM (synchronous dynamic random access memory). Thus, in a non-ECC memory, an 8-byte data word can be distributed among eight ×8, four ×16, or sixteen ×4 memory devices. The devices among which a word is distributed are referred to collectively as a "rank". Thus, a typical non-ECC dual-inline memory module (DIMM) can include two ranks of eight integrated circuit memories on a printed-circuit board (PCB).

ECC encoding typically adds eight bits per eight bytes so that a 64-bit (8-byte) word consumes 72 bits (nine bytes) in ECC encoded form. Thus, instead of being distributed over eight memory devices, an ECC encoded word is distributed over nine integrated circuit memories. Thus, a typical ECC memory module (e.g., DIMM) includes nine memory devices, and a typical dual-rank ECC DIMM includes 18 integrated circuit memories. Other configurations are known as well. Generally, non-ECC memory modules have an integer multiple of eight integrated circuit memories, while ECC memory modules can have one additional memory device per rank to handle the excess capacity required by ECC encoding.

In the case of an EOS memory module, both the ECC controller and the ECC excess capacity are provided on the memory module(s). In the case of a conventional (non-EOS) ECC memory module, the controller is off-module, e.g., on a baseboard, but the excess capacity is provided on the module. In the case of ECC memory system 100, both ECC-capable memory controller 102 and OMMES memory 104 that provides the excess capacity are off module, that is, not on a conventional memory module. This allows ECC functionality (hardening against errors in stored data) using conventional non-ECC memory modules.

Figure 2:
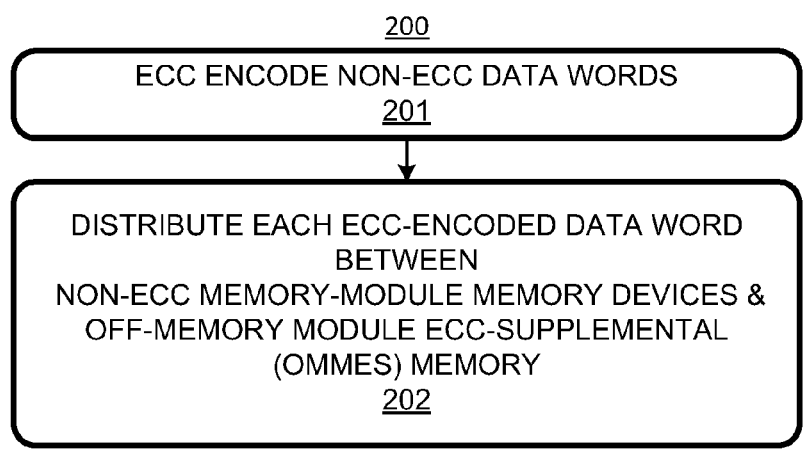
FIG. 2 is a flow chart of an ECC memory process in accordance with an example.

In a controller-implemented process 200, flow-charted in FIG. 2, data words are ECC encoded at 201. For example, the ECC encoding can use Hamming encoding or TMR encoding. The resulting ECC-encoded data words are stored in a distributed manner between non-ECC memory modules and OMMES memory at 202.

Figure 3:
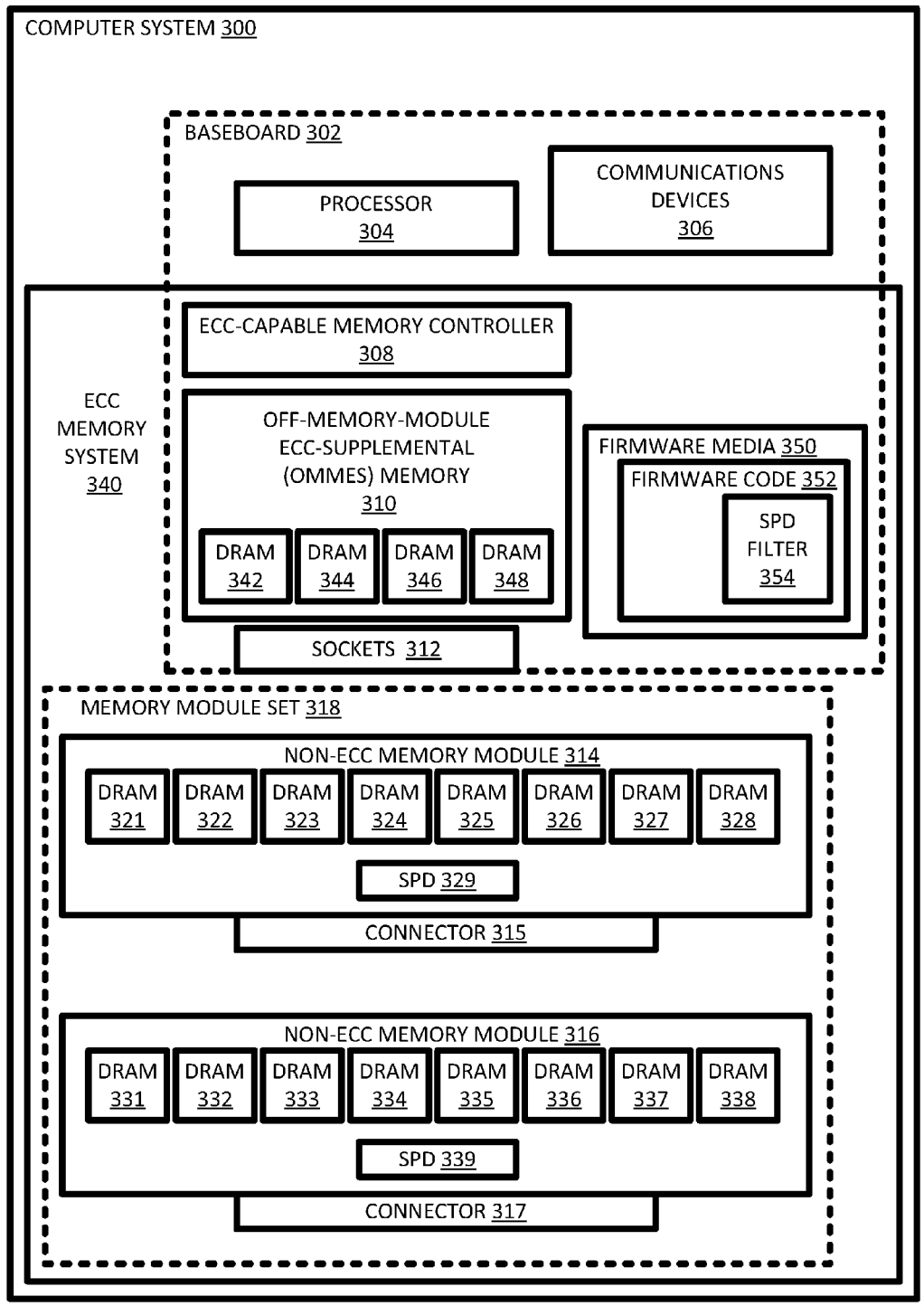
FIG. 3 is a schematic diagram of a computer system hosting an ECC memory system.

"Off-module", as used herein, can be understood in the context of computer 300, shown schematically in FIG. 3. Computer 300 includes a baseboard 302 on which are mounted a processor 304, communications devices 306, an ECC controller 308, and off-memory-module ECC-supplemental (OMMES) memory 310. Note that while baseboard 302 may be characterized as a "module" that has memory mounted on it, it is not a "memory module" as the phrase is used herein and by those skilled in the art. However, baseboard does include sockets 312 into which non-ECC memory modules can be installed. In variations, the number of sockets can vary, e.g., from 1 socket to 16 sockets. OMMES memory 310 is located close to sockets 312, and memory control, address, command, and data signal lines (not shown) are routed so as to ensure signal integrity.

As illustrated in FIG. 3, two 4 GB (Gigabyte) non-ECC DIMMs 314 and 316 of a memory module set 318 are installed in sockets 312 using connectors 315 and 317, respectively. DIMM 314 includes eight 4 Gb (Giga-bit) integrated circuit memories 321-328, while DIMM 316 includes eight 4 Gb integrated circuit memories 331-338.

Thus, each DIMM 314, 316 can store 4 GB (Giga-Bytes) of data. However, when ECC encoded, 4 GB of data requires an extra 4 Gb (Giga-bits) capacity. For DIMM 314 this is provided by the 4 Gb memory device (SDRAM) 342 of OMMES memory 310; likewise, for DIMM 316, the excess capacity is handled by memory device 344 of OMMES memory 310.

Collectively, ECC controller 308, ECC-supplemental memory 310, and memory module set 318 define a populated ECC memory system 340 that is a subsystem of computer 300. Alternatively, ECC memory system 340 may be unpopulated, e.g., when no memory modules are installed in sockets 312.

To accommodate more than two memory modules or memory modules with more than one rank of memory devices per memory module, ECC-supplemental memory 310 may have additional memory devices installed, e.g., memory devices 346 and 348. Instead of having one ECC-supplemental memory device per eight memory devices on memory modules, other ratios can be implemented, either using memory devices of different widths (e.g., ×4, ×8, ×16), different capacities, or different dice per package or to accommodate ECC encoding schemes that add more than one bit per byte. For example, a dual-die SDRAM can take the place of two single-die SDRAM for two ranks. Also, a higher capacity supplemental SDRAM can supplement for a DIMM with lower capacity SDRAMs.

Some alternative configurations for the OMMES memory include the following. 1) One single-die DRAM device to support a single-ranked SO-DIMM. 2) Two single-die DRAM devices to support dual-ranked SO-DIMMs (single-die DRAM devices are much cheaper than dual-die ones). 3) One dual-die DRAM device to support single-ranked SO-DIMM (and single and dual density configurations), dual-ranked SO-DIMM (for emulating two single-density configuration to support a dual-ranked SO-DIMM)

While, in some embodiments, ECC encoding adds one bit per byte of non-ECC-encoded data words, in other embodiments, more than one-bit per byte may be added, e.g., to allow correction of multi-bit data errors. In most cases, the ECC-capable memory controller will distribute at least 80% of each data word to memory modules and at most 20% to ECC-supplemental memory 310.

In addition to including memory devices, memory modules typically include serial presence detect (SPD) devices that are intended to inform memory controllers of the capabilities of and requirements for the host memory modules. Thus, SPD devices store SPD data that may specify information about capacity, timing, organization, and other aspects of configuration including whether or not it supports for the host memory module. For example, memory module 314 includes SPD 329 that specifies, among other things, that its host memory module is a non-ECC memory module; memory module 316 includes an essentially similar SPD 339. Thus, SPD data is used, among other purposes, to distinguish ECC memory modules from non-ECC memory modules.

Conventionally, as a computer is booted, firmware code (e.g., including BIOS code, system firmware, and memory-controller code) reads the SPD data for installed memory modules and programs a memory controller accordingly. ECC memory system 340 includes firmware code 352, encoded on firmware (e.g., flash memory on baseboard 302) media 350, that includes an SPD filter 354. SPD filter 354 when executed by processor 304, in effect, filters out SPD data indicating that a memory module is a non-ECC memory module and replaces that memory-controller programming indicating that the available memory is ECC memory. In other respects, SPD data from installed modules may be, in effect, passed through to memory controller 308.

One approach to filtering is to provide ECC SPD, e.g., on the baseboard rather than on a memory module, that indicates the presence of an ECC memory module even when no ECC memory module is present. The filtering can include substituting the ECC SPD data for some of the memory-module SPD data. In any event, memory controller 308, which is capable of using either ECC memory or non-ECC memory, will operate as if ECC memory modules are installed even though only non-ECC memory modules are installed.

OMMES memory 310 is selected to be at least as capable (e.g., in size and speed) as any memory expected to be installed in sockets 312. If the capabilities of installed memory modules exceed those of OMMES memory 310, filter 354 can alter the SPD data to effectively downgrade the memory modules to match the capabilities of OMMES memory. Note that firmware code 352 can serve other purposes, e.g., other functions associated with a basic input output system (BIOS), extensible firmware interface (EFI), or other system firmware. The OMMES memory may but need not store ECC check bits; the OMMES memory may store data bits only or a combination of data bits and check bits. For example, the 72-bits of an ECC-encoded data word can be distributed in any suitable manner between the memory module(s) and the OMMES memory.

Firmware code 352 further provides memory controller programming to accommodate the timing and training variations (due to flight time and distance differences) between the first SDRAM device and the last SDRAM device on the DIMM. This programming involves a training sequence for calibrating address, clock, and data timing for each byte associated with each DRAM device. For each data group, BIOS will program the timing between a data strobe to latch data and the data signals in the memory controller to accommodate the difference in signal propagation delay from the memory controller to the embedded (on-board) devices and that of the DRAM devices on the SO-DIMM. In the illustrated example, the training sequence can accommodate variations across a rank including OMMES memory on baseboard 302 along with devices on the memory modules. Note that the supplemental SDRAM devices can be placed on the baseboard close to the memory module connectors and route memory control, address, command, data signals appropriately to provide the right level of signal integrity.

SPD filter 354 makes it possible to use OMMES memory 342 with a conventional memory controller that then functions with no awareness that the memory modules are non-ECC memory modules. In an alternative embodiment, an OMMES-aware memory controller may be used, obviating the need for an SPD filter.

Figure 4:
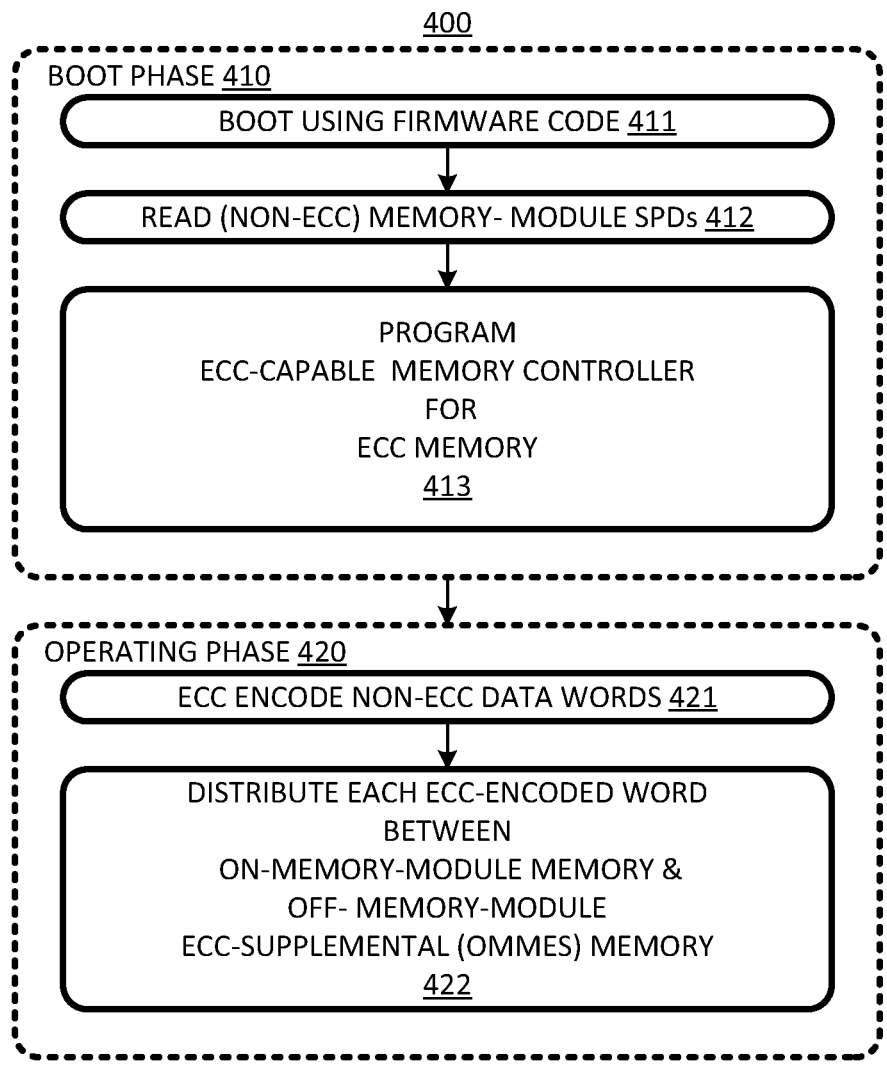
FIG. 4 is a flow chart of an ECC memory process that can be implemented on the ECC memory system of FIG. 3 in accordance with an example.

Computer system 300 supports a process 400 flow charted in FIG. 4. Process 400 includes a boot phase 410 and an operating phase 420. In boot phase 410, e.g., after a system start or restart, the computer is booted beginning at 411. During booting, boot firmware is executed so that, among other actions, SPD data is read at 412 from installed memory modules. In system 300, the SPD data indicates that the installed memory modules are non-ECC memory modules. At 413, the ECC-capable memory controller is programmed by processor 304 executing firmware code 352 for operation using ECC memory. From the perspective of ECC-capable memory controller 308 and contrary to fact, the installed memory modules are ECC memory modules.

If at 411, it turns out that the SPD data indicates that the memory modules are ECC modules, then firmware code 352 will cause processor 304 to program ECC-capable memory controller 308 to work with the ECC memory modules and not use the OMMES memory. Alternatively, firmware code could program sufficiently capable memory controller to use the OMMES memory to achieve a more robust ECC code, e.g., adding two bits per byte to be able to correct at least some multi-bit errors. In some examples, ECC-only memory controllers are used that are not designed to be used in a non-ECC mode.

Thus, in an example, depending on whether ECC or non-ECC memory modules are installed, a ratio of the lengths of said ECC data words to the lengths of said non-ECC data words can be between 9:8 and 10:8 inclusive. Likewise, the ratio of the portion of an ECC-encoded data word stored on devices on ECC-supplemental memory to the portion of that ECC-encoded data word stored on said memory module set can be between 1:9 and 1:8 inclusive.

During operating phase 420, memory controller 308 ECC encodes 64-bit non-ECC data words into 72-bit ECC-encoded data words at 421. Each data word is distributed, at 422, among the nine devices of the corresponding ECC rank. For example, a data word can be distributed among on-module DRAMS 321-328 and OMMES DRAM 342. Likewise, during a read operation, 72-bit words are read (across memory modules and OMMES memory) and decoded by memory controller 308 into non-ECC encoded data words for consumption by processor 304. Of course, ECC and non-ECC data words of other sizes can be accommodated in other examples.

Typical SPD data includes a Factory/Vendor Data region which may be READ-only and a Writable region for tagging the DIMM, for example, with diagnostic information. Some small-outline DIMMs (SO-DIMMs) may not lock the Vendor region.) A major portion of the SPD information describes the DRAM device. SPD data can describe the Module configuration. Factory, BIOS, Management Processor, e.g., an internal lights-out (iLO) processor, can write and read SPD data.

Various examples invoke different approaches to filtering or updating SPD data. The following list is meant to be illustrative but is non-limiting. 1) Use the module (e.g, SO-DIMM) SPD data as is without updating or filtering it. Get the BIOS to program the memory controller based on the embedded DRAM device; allow an SO-DIMM which matches the necessary characteristics of the embedded DRAM device. 2) Update the SPD content as spare/option part; this will create a new SKU part number. 3) Reprogram the "off-the-shelf" SO-DIMM SPD (before installation) with data representing the new ECC configuration at the factory for example. 4) Via system BIOS or iLO (management processor), reprogram the SO-DIMM SPD after it has been installed (into the server. 5) Redirect SPD access to a new location (away from the SO-DIMM) for the sake of the initial memory controller/system configuration; keep SPD access to the SO-DIMM for the sake of diagnostic information (READ and WRITE).

Herein, a "system" is a set of interacting process actions or non-transitory tangible elements, wherein the elements can be, by way of example and not of limitation, mechanical components, electrical elements, atoms, physical encodings of instructions. Herein, "process" refers to a system, the elements of which are process actions that cause physical transformations.

Herein, a "computer" refers to a hardware machine for manipulating physically encoded data in accordance with physically encoded instructions. Depending on context, reference to a computer may or may not include software installed on the computer. Herein, "processor", "controller", "media", "memory", and "device" refer to hardware elements that may or may not be programmed or programmable. Herein, "media" and "memory" refer to devices including non-transitory tangible material in or on which information is or can be encoded with information including data and instructions. Herein, "processor" refers to hardware for executing instructions. A processor can be a monolithic device, e.g., integrated circuit, a portion of a device, e.g., core of a multi-core integrated circuit, or a distributed or collocated set of devices. Herein, "communications devices" refers to devices used for communication, including both network devices and devices used for input and output, e.g., human interface devices.

Herein, a "memory-module set" is a set of one or more memory modules, as the term "memory module" is understood by those skilled in the art. As used herein, a "memory module" includes plural integrated-circuit memory devices attached to a common structure, typically a printed circuit board. Herein, "ECC-supplemental memory" refers to memory used to supplement non-ECC memory devices to complete a rank in an ECC memory system. Off-memory-module ECC-supplemental (OMMES) memory is ECC-supplemental memory that is not on a memory module. SPD devices and data are provided for memory modules but not for the OMMES memory disclosed herein. Herein, a "memory device" is an integrated circuit package designed for storage and retrieval of data; the memory devices of interest herein store at least 1 Gb of data per device.

Herein, an "ECC-capable memory controller" is a memory controller that can, at least when suitably programmed, encode non-ECC data into ECC data and decode ECC data into non-ECC data. Typically, an ECC-capable memory controller can be selectively programmed to operate either with non-ECC memory modules and ECC memory modules. In the present context, an ECC-capable memory controller can be programmed to operate with ECC memory even though it is actually reading from and writing to non-ECC memory modules (plus ECC-supplemental memory).

In this specification, related art is discussed for expository purposes. Related art labeled "prior art", if any, is admitted prior art. Related art not labeled "prior art" is not admitted prior art. In the claims, "said" introduces elements for which there is explicit verbatim antecedent basis; "the" introduces elements for which the antecedent basis may be implicit. The illustrated and other described embodiments, as well as modifications thereto and variations thereupon are within the scope of the following claims.

What is claimed is:

1. A memory system comprising:
   a memory module set of one or more non-ECC memory modules, wherein each respective non-ECC memory module of the one or more non-ECC memory modules includes a storage device storing capability data indicating that the respective non-ECC memory module is a non-ECC memory module;
   an off-memory-module memory not on a memory module of the memory module set;
   an ECC-capable memory controller coupled to the memory module set and the off-memory-module memory; and
   a media storing instructions executable to read the capability data of each respective non-ECC memory module and to configure the ECC-capable memory controller to control each non-ECC memory module of the one or more non-ECC memory modules as an ECC memory module, and the ECC-capable memory controller to encode data into ECC-encoded data words, and to distribute the ECC-encoded data words between the memory module set and the off-memory-module memory.

2. The memory system of claim 1, further comprising a baseboard having slots into which the one or more non-ECC memory modules are inserted, the ECC-capable memory controller and the off-memory-module memory being mounted on the baseboard and not on a non-ECC memory module of the memory module set.

3. The memory system of claim 1, wherein the capability data stored in the storage device of each non-ECC memory module of the one or more non-ECC memory modules comprises serial presence detect (SPD) data.

4. The memory system of claim 3, further comprising ECC SPD data tangibly encoded on a device not part of the memory module set, the ECC SPD data indicating presence of an ECC memory module although no ECC memory module is present in the memory system, the instructions to replace some of the SPD data from the one or more non-ECC memory modules with the ECC SPD data.

5. The memory system of claim 1, wherein each of one or more non-ECC memory modules has an integer multiple of eight memory devices.

6. The memory system of claim 1, wherein the instructions comprise BIOS code.

7. The memory system of claim 1, wherein the instructions comprise memory controller code.

8. The memory system of claim 1, wherein the instructions are executable to:

replace the capability data indicating that the respective non-ECC memory module is a non-ECC memory module with replacement capability data indicating that the respective non-ECC memory module is an ECC memory module, and program the ECC-capable memory controller according to the replacement capability data.

9. The memory system of claim 8, wherein the capability data indicating that the respective non-ECC memory module is a non-ECC memory module comprises serial presence detect (SPD) data.

10. A method executed in a computer, comprising:

reading capability data stored in a memory module, the capability data indicating that the memory module is a non-ECC memory module;

modifying the capability data and configuring an ECC-capable memory controller according to the modified capability data so that the ECC-capable memory controller controls the memory module as an ECC memory module;

encoding, by the ECC-capable memory controller, non-ECC data words to ECC data words; and writing the ECC data words by distributing the ECC data words between the memory module and an off-memory-module memory not on the memory module.

11. The method of claim 10, wherein the writing includes writing a portion of an ECC data word to a memory device mounted on a baseboard and writing another portion of the ECC data word to a memory device included in the memory module installed on the baseboard.

12. The method of claim 10, wherein the capability data comprises serial presence detect (SPD) data stored in an SPD device on the memory module.

13. The method of claim 12, wherein the modifying comprises replacing as least some of the SPD data with ECC SPD data stored on a device mounted outside of the memory module.

14. The method of claim 10, wherein the writing distributes an ECC data word among nine memory devices, eight of which are in the memory module and one of which is included in the off-memory-module memory.

15. A system comprising:

a baseboard having slots for receiving non-ECC memory modules;

an off-memory-module memory mounted on the baseboard and not in the non-ECC memory modules;

an ECC controller; and a media storing instructions executable to:

read capability data of the non-ECC memory modules, the capability data indicating that the non-ECC memory modules are non-ECC memory modules, and configure the ECC-capable memory controller to control the non-ECC memory modules as ECC memory modules, wherein the ECC controller is to convert non-ECC encoded data words into ECC-encoded data words, and distribute bits of the ECC encoded words between the non-ECC memory modules and the off-memory-module memory.

16. The system of claim 15, further comprising:

a processor mounted on the baseboard, wherein the instructions are executable on the processor.

17. The system of claim 15, further comprising the non-ECC memory modules, the non-ECC memory modules including plural ranks of memory devices, and the off-memory-module memory including at least one memory device for each of the ranks.

18. The system of claim 15, wherein the instructions are executable to:

modify the capability data read from the non-ECC memory modules, and wherein the configuring of the ECC controller is according to the modified capability data.

19. The system of claim 18, wherein the modifying of the capability data produces the modified capability data that indicates that the non-ECC memory modules are to be used as ECC memory modules.

20. The system of claim 19, further comprising:

a storage device outside of the non-ECC memory modules, the storage device storing capability data indicating that the system has ECC memory modules, wherein the modifying of the capability data read from the non-ECC memory modules is based on the capability data read from the storage device.

* * * * *